(12) United States Patent
Bierer

(10) Patent No.: US 6,275,022 B1
(45) Date of Patent: Aug. 14, 2001

(54) PASSIVE VOLTMETER WITH PARTIALLY COMPRESSED VOLTAGE RANGE DISPLAY AND HOUSING WITH INTERNAL METALLIC COATING

(76) Inventor: Walter S Bierer, 183 Elton Rd., Blythewood, SC (US) 29016

( * ) Notice: Subject to any disclaimer, the term of this patent is extended or adjusted under 35 U.S.C. 154(b) by 0 days.

(21) Appl. No.: 09/412,410

(22) Filed: Oct. 5, 1999

Related U.S. Application Data

(60) Provisional application No. 60/103,103, filed on Oct. 5, 1998.

(51) Int. Cl.[7] ............... G01R 19/00; G01R 1/04; G01R 1/06; G01R 1/08; G01R 15/08
(52) U.S. Cl. ............ 324/149; 324/72.5; 324/115; 324/132
(58) Field of Search ............ 324/72, 72.5, 114–116, 324/119, 131–133, 149, 156, 551, 552

(56) References Cited

U.S. PATENT DOCUMENTS

| | | |
|---|---|---|
| 2,091,521 | 8/1937 | Pattison . |
| 2,988,700 * | 6/1961 | Rosinek ............... 324/149 X |
| 3,041,535 * | 6/1962 | Cochran ............... 324/132 X |
| 3,257,616 * | 6/1966 | Andrushkiw et al. ........... 324/132 X |
| 3,268,813 * | 8/1966 | Pendleton ............... 324/132 |
| 3,522,533 * | 8/1970 | Bergero ............... 324/149 |
| 3,969,671 | 7/1976 | Smith . |
| 4,336,494 * | 6/1982 | Shindo et al. ............... 324/551 X |
| 4,594,546 | 6/1986 | Greene . |
| 4,634,968 * | 1/1987 | Aslan ............... 324/72.5 X |
| 4,714,916 * | 12/1987 | Schweitzer, Jr. ............... 324/133 X |
| 4,794,329 * | 12/1988 | Schweitzer, Jr. ............... 324/133 X |
| 6,016,105 * | 1/2000 | Schweitzer, Jr. ............... 324/133 X |

* cited by examiner

*Primary Examiner*—Gerard R. Strecker
(74) *Attorney, Agent, or Firm*—Michael A Mann; Nexsen Pruet Jacobs & Pollard LLC

(57) ABSTRACT

A passive voltmeter for high voltage transmission lines that accurately measures and displays a wide range of voltages. A d'Arsonval type meter movement is preferably used in conjunction with the voltmeter wherein the scale contains a linear range and a compressed, nearly-logarithmic range. A circuit controls the pointer so that the deflection is linear for a low range of voltages while a high range of voltages is deflected in a compressed manner. The term "compressed" means that the display is scaled in a logarithmic manner although not a true logarithmic function. The circuit comprises one or more parallel branches with a meter movement and a resistor in the first branch; each additional branch, if more than one, contains a resistor and at least one diode connected in series. The additional branches have an increasing number of serially connected diodes so that the turn-on voltage for each branch increases with additional branches, while the resistors contain a decreasing values of resistance for each additional branch. The passive voltmeter comprises a housing internally coated with a conductive material, a high resistance prong extending from the housing, and a meter movement connected to the housing. As the prong touches the line, a capacitive charge is formed with the housing as the first plate and the physical surroundings as the second plate. The meter movement is deflected by the charging current since the current will be proportional to the voltage in the transmission line.

19 Claims, 2 Drawing Sheets

PASSIVE VOLTMETER WITH PARTIALLY COMPRESSED VOLTAGE RANGE DISPLAY AND HOUSING WITH INTERNAL METALLIC COATING

PRIORITY CLAIM

The present invention incorporates by reference and claims the benefit of the filing data of provisional application 60/103,103, filed Oct. 5, 1998.

BACKGROUND OF THE INVENTION

1. Field of Invention

The present invention relates to voltmeters and in particular, voltmeters for use with high voltage transmission lines.

2. Discussion of Background

Voltmeters for high voltage transmission lines are well known. Electric utility employees must test voltages on transmission lines after storms or in other situations. Obviously, voltmeters testing these lines must have sufficient accuracy to alleviate the inherent safety problems with the high voltage lines. The design simplicity of the voltmeter furthers helps in maintaining safety. Various types of voltmeters have been devised for measuring high voltages, such as U.S. Pat. No. 4,594,546 to Green et al. and U.S. Pat. No. 3,969,671 to Smith.

Due to OSHA regulations, electric utility employees must test the nominal line voltage on a de-energized electric line prior to beginning work on the line. Depending on the type of line to be tested, the voltages can range from 200 volts for a secondary distribution line to 14,000 volts for a primary distribution line while primary transmission lines carry voltages up to 300,000 volts. The wide ranges of voltages encountered by utility employees necessitates the use of several voltmeters capable of handling various voltage ranges. A voltmeter with a high resolution is necessary for measuring secondary and primary distribution lines while the high voltages for primary transmission lines require a voltmeter with relatively low resolution.

Various measuring devices, such as ohmmeters and flow meters, have been devised with logarithmic displays; however, the logarithmic output is a natural consequence for these measurements and not produced by additional thought or equipment. An ohmmeter comprises a fixed internal voltage source with a regulating resistor. When a resistor is connected to the ohmmeter, the deflection of the meter movement is inversely proportional to current flowing through the resistor and regulating resistor due to Ohm's Law; consequently, the high-resistance end of the scale is compressed. Also, the energy required to compress the spring in a flowmeter is expressed by a logarithmic equation thereby causing the meter range to be compressed. Although the scale in ohmmeters and flowmeters are naturally compressed, a voltmeter inherently produces a linear output; however, it is necessary to have a voltmeter with a compressed display for high-voltage lines to allow a single meter to measure the wide range of voltages. Therefore, there is need for voltmeter capable of accurately measuring a wide range of voltages while providing a higher degree of resolution at lower voltages than higher voltages.

SUMMARY OF THE INVENTION

According to its major aspects and broadly stated, the present invention is a passive voltmeter capable of accurately measuring and displaying a wide range of voltages. A d'Arsonval type meter movement is preferably used in conjunction with the voltmeter wherein the scale contains a first portion and a second portion. A circuit controls the pointer in such a way that the deflection is linear for a lower, first portion of the range of voltages while a high range of voltages is deflected in a compressed manner in the second, higher portion of the range. The term "compressed" means that the display is scaled in a non-linear manner, particularly one where the spacing between voltage increments becomes smaller and smaller higher up the range, although not necessarily an exact logarithmic function. The circuit comprises a plurality of parallel branches with a meter movement an da resistor in the first branch; each additional branch contains a resistor and at least one diode connected in series. The additional branches have an increasing number of serially connected diodes so that the turn-on voltage for each branch increases with additional branches, while the resistors contain a decreasing value for each additional branch. Thus, a branch will not carry current until the turn-on voltage for the branch has been exceeded. Consequently, resistor values can be selected so that the meter movement operates in an approximately linear fashion for a portion of branches while having a compressed response when additional branches are turned on.

Although the circuit may be used with any voltmeter, preferably the voltmeter is passive. The voltmeter comprises a housing internally coated with a conductive material, a high resistance probe extending from the housing, an da meter movement connected to the housing. As the probe touches the transmission line, a capacitive charge is formed with the housing as the first plate and the physical surroundings of the meter as the second plate. The meter movement is deflected by the charging current since the current will be proportional to the voltage in the transmission line.

A major feature of the present invention is the use of a scale with linear and a compressed portions. The circuit branches containing an increasing number of serially connected diodes enables this feature by having the different branches' ability to carry current dependent upon the input voltage. For an utility employee where the voltage ranges below 14,000 volts for primary and secondary distribution lines, but up to 300,000 volts for primary transmission lines, the ability to have a higher resolution for lower voltages but yet adequate resolution for higher voltages on one scale in one meter is an important convenience. It eliminates the need for a range select switch and allows one meter to be used to meet all electrical transmission metering requirements.

A major advantage of the present invention is the ability to display a wide range of voltages using a single voltmeter. This advantage avoids use of several meters that each handle a different range of voltages.

Another important advantage of the present invention is the simplicity of design for the passive voltmeter. The voltmeter does not have a power source, amplifier or other complex circuitry that might easily fail. As a result of this design simplicity, safety is increased because the utility and accuracy of the meter does not depend on the goodness of the batteries that have a shelf life.

Other features and advantages of the present invention will be apparent to those skilled in the art from a careful reading of the Detailed Description of a Preferred Embodiment presented below and accompanied by the drawings.

DETAILED DESCRIPTION OF A PREFERRED EMBODIMENT

Figure 1A:
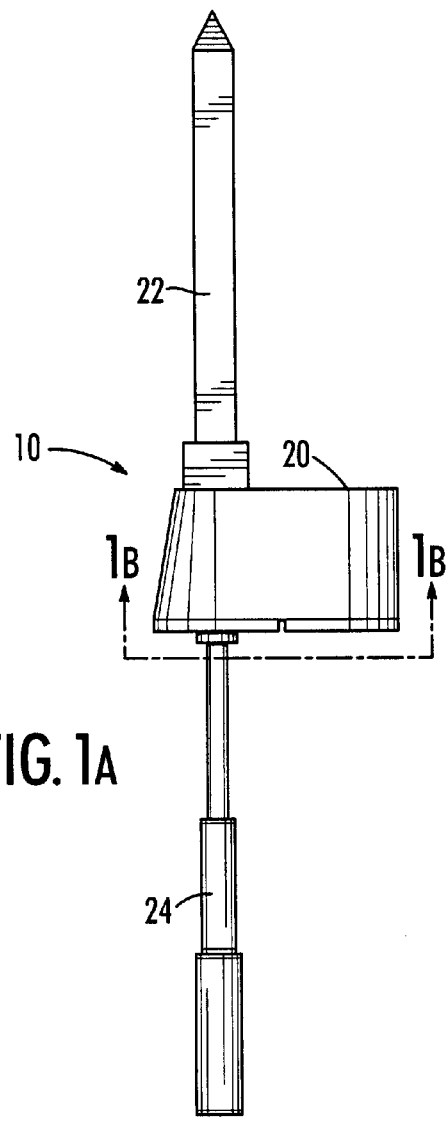
FIG. 1 is a side view of the voltmeter, according to a preferred embodiment of the present invention.
FIG. 1B is a bottom end view of the voltmeter of FIG. 1B.
Figure 1B:
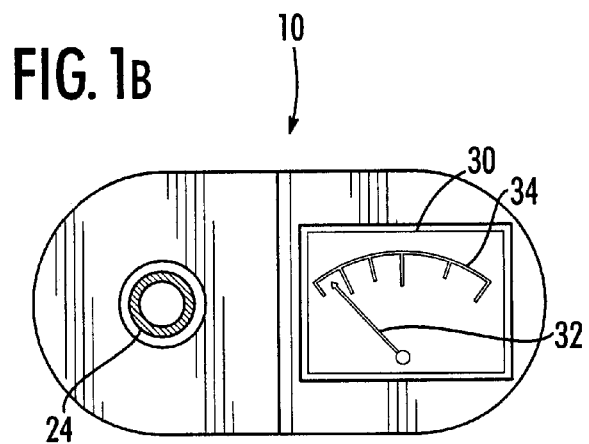
Figure 2:
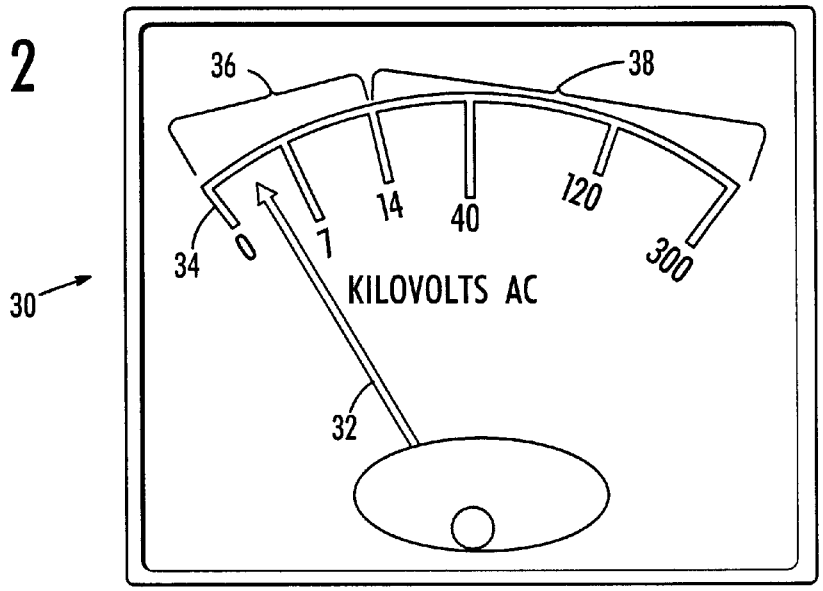
FIG. 2 is a front view of the meter movement, according to a preferred embodiment of the present invention.

Referring now to the figures, the present invention is a passive voltmeter capable of accurately measuring an displaying a wide range of voltages. The passive voltmeter, generally referred to by reference number 10, comprises a housing 20, a probe 22 extending from housing 20, a handle 24, and electrical circuitry to provide a meter movement 30 connected to housing 20 and oriented so that meter movement 30 is viewed from the end of handle 24 so that, when voltmeter 10 is held up, the user can look up at meter to read it. A scaling circuit 40, controls a pointer 32 on meter movement 30 so that the deflection is linear for a lower, first portion of the range of voltages 36 while a higher, second portion of the range of voltages 38 is deflected in a compressed manner. The term "compressed" means that the display is scaled in a near-logarithmic manner.

Figure 4:
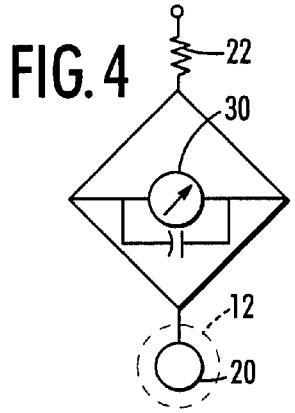
FIG. 4 is a schematic of the passive voltmeter, according to a preferred embodiment of the present invention.

Housing 20 has a top end with a probe 22 and an opposing bottom end with a handle 24. Probe 22 is formed preferably from a high resistance material and is in electrical connection with meter movement 30 so that meter movement 30 responds to the output of probe 22. Although, handle 24 is preferably telescoping so that probe 22 can come into contact with a transmission line, any other attachment means to allow probe 22 to engage transmission line could also be used. Housing 20 is internally coated with an electrically conductive material and is connected to meter movement 30. Numerous electrical conductors, such as copper, aluminum, or steel, could be used to internally coat housing 20; also, many different methods are known in the art to internally coat housing 20 with a conductive material, but preferably housing 20 is internally painted with an electrically conductive paint. The circuit created when probe 22 engages the transmission line is illustrated in FIG. 4. A capacitive charge is formed with the electrically conductive paint as the first plate and the physical surroundings 12 as the second plate. Housing 20 acts as the dielectric between the two. The electrical current flowing through meter movement 30 is a linear function of the capacitance, voltage of the transmission line, and the frequency of the transmission line. Since both the capacitance and frequency are essentially stable, the current will be proportional to the voltage in the transmission line.

Handle 24 is preferably a telescoping handle, as shown, so as to permit an operator to touch probe 22 to a transmission line that is farther away. Handle is preferably threaded to housing 20.

Meter movement 30 is preferably a d'Arsonval type meter movement wherein the scale 34 contains two portions: a first, linear range 36 and a second, compressed range 38. It will be clear to one skilled in the art that a rectifying network must be used as part of the electrical circuitry of meter movement 30 so that only direct current flows to meter.

Figure 3:
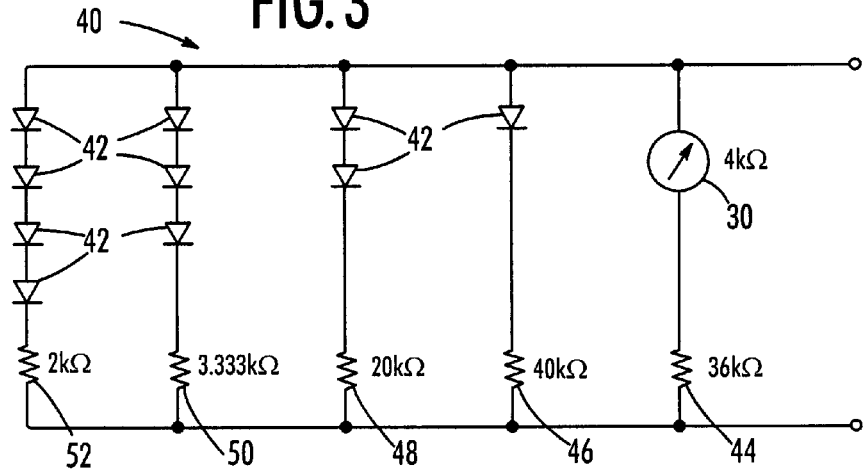
FIG. 3 is a schematic of the scaling circuit, according to a preferred embodiment of the present invention.

Although the meter movement 30 may be used with any voltmeter, most preferably meter movement 30 is used with passive voltmeter 10. An electrical circuit 40, illustrated schematically in FIG. 3, controls the pointer 32 so that the deflection is linear for a first portion of the scale, namely, the low range of voltages, while a second portion of the scale for a high range of voltages is deflected in a non-linear, preferably compressed manner. Although resistors 44, 46, 48, 50, and 52 have been illustrated with specific values, many different values may be used; consequently, the values of resistors 44, 46, 48, 50, and 52 can be selected so that pointer 32 operates in an approximately linear movement for a portion of scale 34 while having a compressed response as additional branches are turned on.

Scaling circuit 40 comprises a plurality of parallel branches with meter movement 30 and a resistor 44 in the first branch to create a voltage divider; each additional branch contains a resistor and at least one diode connected in series. The additional branches have an increasing number of serially connected diodes so that the turn-on voltage for each branch increases with additional branches, while the resistors preferably have a decreasing value of resistance for each additional branch. Thus, a branch will not carry current until the turn-on voltage for the branch has been exceeded. The turn-on voltage for each branch depends upon the type of diode that is used; alternatively, any other type of element that functions as an open circuit until approximately 0.4 volts turn on is exceeded may be used instead of diodes. Although silicon diodes with an about 0.4 volts turn-on voltage are preferred, germanium diodes with approximately 1.2 volts turn-on voltage could also be used. For example, a branch having a single silicon diode requires about 0.7 volts to carry current, while a branch having three silicon diode requires about 2.1 bolts to carry current.

A preferred alternative electrical circuitry has only one branch where the diode, rather than being a signal diode, is rated at a current of several hundred times the current expected to be drawn in the present circuit, most preferably a rating of approximately one ampere. In addition to being less expensive than signal diodes normally used in milliampere circuits, a one ampere diode would not receive the current to turn it on but would gradually conduct current as the voltage sensed by probe 22 rose form a few tens of kilovolts to a few hundred kilovolts, providing a smooth transition from linear to compressed portions of the scale.

In operation, probe 22 is placed in contact with a transmission line to measure the voltage. The charging current created by capacitance between housing 20 and the physical surroundings 12 is rectified and carried by meter movement 30. Depending upon the value of the voltage, a particular number of branches will carry current. Based upon the number of branches that carry current, the pointer 32 will be operating in either a linear or compressed manner and will display the measured voltage.

The present meter eliminates the voltage range selection switch and allows one meter to be used for all electrical power transmission requirements. The elimination of the switch saves the need for repeated tests as the right range is found by the employee testing the line.

It will be apparent to those skilled in the art that many changes and substitutions can be made to the preferred embodiment herein described without departing from the spirit and scope of the present invention.

What is claimed is:

1. A voltmeter for use in determining the voltage carried by a conductor, said voltmeter comprising:
   a housing having an interior surface;
   a probe carried by said housing and adapted to produce an output in response to the presence of a voltage in a conductor;
   electrical circuitry carried within said housing and in electrical connection with said probe so that said electrical circuitry receives said output of said probe, said electrical circuitry including a metallic coating carried on said interior surface, and said electrical circuitry being adapted to produce an output proportional to said voltage in said conductor; and
   means carried by said housing for indicating voltage, said indicating means in electrical connection with said electrical circuitry and having a scale with a first portion and an adjacent second portion, said first portion being a linear and said second portion being nonlinear.

2. The voltmeter as recited in claim 1, wherein said second portion is compressed.

3. The voltmeter as recited in claim 1, wherein said electrical circuitry includes a conductor acting as one plate of a capacitor and said housing acting as a dielectric of said capacitor.

4. The voltmeter as recited in claim 1, wherein said electrical circuit includes a plurality of branches arranged electrically in parallel.

5. The voltmeter as recited in claim 1, wherein said electrical circuit includes a plurality of branches arranged electrically in parallel, each branch of said plurality of branches having a higher activation voltage than any previous branch.

6. The voltmeter as recited in claim 1, wherein said electrical circuit includes a plurality of branches arranged electrically in parallel, each branch of said plurality of branches having a lower resistance than any previous branch.

7. A voltmeter for use in determining the voltage carried by a conductor, said voltmeter comprising:
   a housing having an interior surface;
   a probe carried by said housing and adapted to produce an output in response to the presence of a voltage in a conductor;
   electrical circuitry carried within said housing and in electrical connection with said electrical conductor and with said probe so that said electrical circuitry receives said output of said probe, said electrical circuitry being adapted to produce an output proportional to said voltage in said conductor, said electrical circuitry including a metallic coating carried by said interior surface of said housing; and
   means carried by said housing for indicating voltage;
   said indicating means in electrical connection with said electrical circuitry and having a scale with a first portion and an adjacent second portion, said first portion being a linear and said second portion being compressed.

8. The voltmeter as recited in claim 7, wherein said electrical circuit includes a plurality of branches arranged electrically in parallel.

9. The voltmeter as recited in claim 7, wherein said electrical circuit includes a plurality of branches arranged electrically in parallel, each branch of said plurality of branches having a higher activation voltage than any previous branch.

10. The voltmeter as recited in claim 7, wherein said electrical circuit includes a plurality of branches arranged electrically in parallel, each branch of said plurality of branches having a lower resistance than any previous branch.

11. The voltmeter as recited in claim 7, wherein said scale ranges up to 300 kilovolts.

12. The voltmeter as recited in claim 7, wherein said first portion ranges up to approximately 14 kilovolts and said second portion ranges up to approximately 300 kilovolts.

13. The voltmeter as recited in claim 8, wherein each branch of said plurality of branches includes at least one diode and one resistor.

14. The voltmeter as recited in claim 9, wherein said each branch of said plurality of branches includes at least one diode and one resistor, said each branch containing more diodes than said any previous branch.

15. A voltmeter for use in determining the voltage carried by a conductor, said voltmeter comprising:
   a housing having an interior surface;
   an electrically resistive probe carried by said housing and extending therefrom, said probe adapted to produce an output in response to the presence of a voltage in a conductor;
   electrical circuitry carried within said housing and in electrical connection with said probe so that said electrical circuitry receives said output of said probe, said electrical circuitry being adapted to produce an output proportional to said voltage in said conductor, said electrical circuitry including a metallic coating carried on said interior surface to act as one plate of a capacitor, said housing acting as said dielectric of said capacitor so that said electrical circuitry can operate without a power source; and
   means carried by said housing for indicating voltage, said indicating means responsive to said electrical circuitry.

16. The voltmeter as recited in claim 15, wherein said indicating means includes a scale having a first portion and a second portion, said first portion being linear and said second portion being compressed.

17. The voltmeter as recited in claim 15, wherein said electrical circuit includes at least one branch arranged electrically in parallel, each branch of said at least one branch having a higher activation voltage and a lower resistance than any previous branch.

18. The voltmeter as recited in claim 17, wherein said each branch of said at least one branch includes at least one diode and a resistor, said each branch including more diodes than said previous branch.

19. The voltmeter as recited in claim 15, wherein said electrical circuitry includes one branch having a diode rated at several hundred times the expected current of said electrical circuit.

* * * * *